United States Patent
Lee et al.

(10) Patent No.: US 7,915,652 B2
(45) Date of Patent: Mar. 29, 2011

(54) INTEGRATED INFRARED AND COLOR CMOS IMAGER SENSOR

(75) Inventors: Jong-Jan Lee, Camas, WA (US);
Douglas J. Tweet, Camas, WA (US);
Jon M. Speigle, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 173 days.

(21) Appl. No.: 12/258,347

(22) Filed: Oct. 24, 2008

(65) Prior Publication Data
US 2010/0102366 A1    Apr. 29, 2010

(51) Int. Cl.
*H01L 31/112* (2006.01)

(52) U.S. Cl. ........ 257/291; 257/292; 257/463; 257/440; 257/461; 257/E27.143; 257/E31.073; 257/E31.054; 257/E31.093; 257/E27.121; 257/E27.136

(58) Field of Classification Search .......... 257/291, 257/292, 440, 461, 463, E31.073, E31.054, 257/E31.093, E27.12, E27.136
See application file for complete search history.

(56) References Cited

U.S. PATENT DOCUMENTS

| | | | |
|---|---|---|---|
| 4,238,760 A | 12/1980 | Carr | |
| 4,651,001 A | 3/1987 | Harda et al. | |
| 5,373,182 A | 12/1994 | Norton | |
| 5,990,506 A * | 11/1999 | Fossum et al. | 257/294 |
| 6,107,618 A | 8/2000 | Fossum et al. | |
| 6,841,816 B2 | 1/2005 | Merrill et al. | |
| 6,852,565 B1 * | 2/2005 | Zhao | 438/73 |
| 7,154,157 B2 | 12/2006 | Bradski et al. | |
| 7,247,851 B2 * | 7/2007 | Okada et al. | 250/339.02 |
| 7,274,393 B2 | 9/2007 | Acharya | |
| 7,364,960 B2 * | 4/2008 | Lyu | 438/204 |
| 2002/0063302 A1 * | 5/2002 | Furumiya et al. | 257/432 |
| 2005/0087829 A1 | 4/2005 | Merrill et al. | |
| 2009/0078973 A1 * | 3/2009 | Hsu et al. | 257/292 |

FOREIGN PATENT DOCUMENTS
JP    2002142228 A    5/2002

OTHER PUBLICATIONS

Lye et al., "IR/Color Composite Image Sensor with VIPS (Vertically Integrated Photodiode Structure)", IEEE Image Sensor Workshop, 2007, p. 267-270.
Koyama, "A daya and Night Vision MOS Imager with Robust Photonic-Crystal-Based RGB-and-IR", IEEE Transactions on Electron Devices, vol. 55, No. 3, Mar. 2008.

* cited by examiner

*Primary Examiner* — Ngan Ngo
*Assistant Examiner* — Benjamin Tzu-Hung Liu
(74) *Attorney, Agent, or Firm* — Law Office of Gerald Maliszewski; Gerald Maliszewski

(57) ABSTRACT

An integrated infrared (IR) and full color complementary metal oxide semiconductor (CMOS) imager array is provided. The array is built upon a lightly doped p doped silicon (Si) substrate. Each pixel cell includes at least one visible light detection pixel and an IR pixel. Each visible light pixel includes a moderately p doped bowl with a bottom p doped layer and p doped sidewalls. An n doped layer is enclosed by the p doped bowl, and a moderately p doped surface region overlies the n doped layer. A transfer transistor has a gate electrode overlying the p doped sidewalls, a source formed from the n doped layer, and an n+ doped drain connected to a floating diffusion region. The IR pixel is the same, except that there is no bottom p doped layer. An optical wavelength filter overlies the visible light and IR pixels.

6 Claims, 7 Drawing Sheets

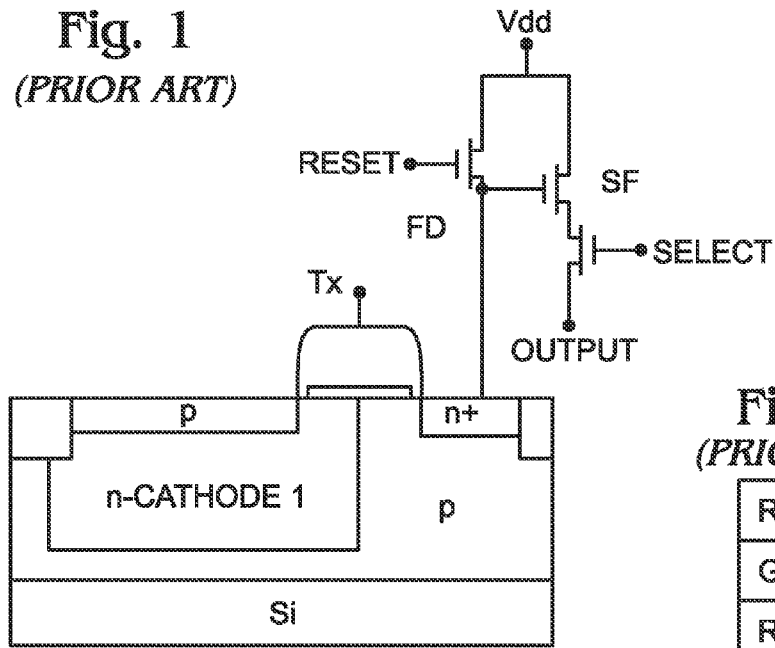
Fig. 1 (PRIOR ART)
Fig. 3 (PRIOR ART)
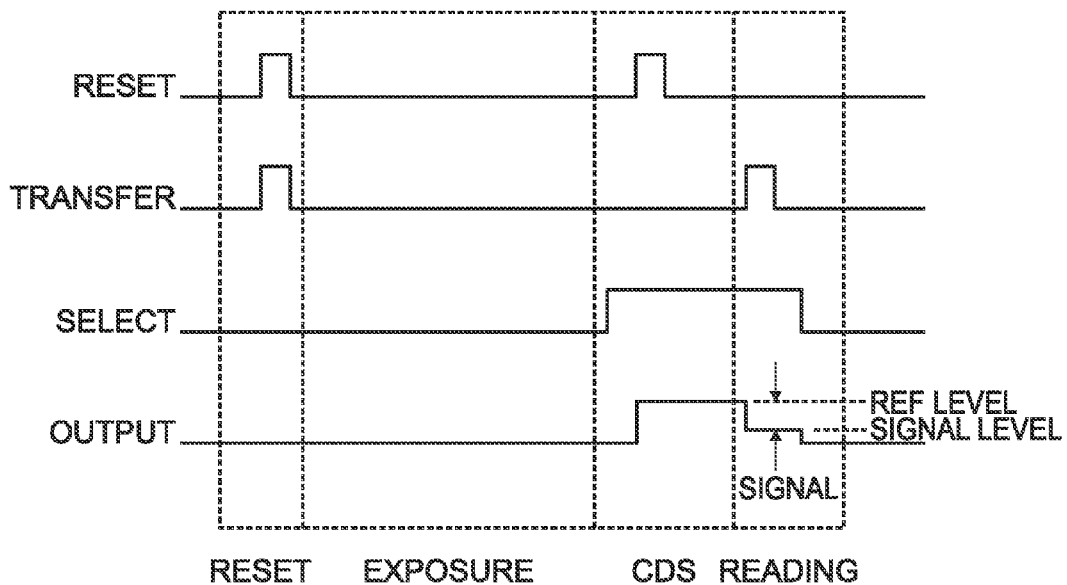
Fig. 2 (PRIOR ART)

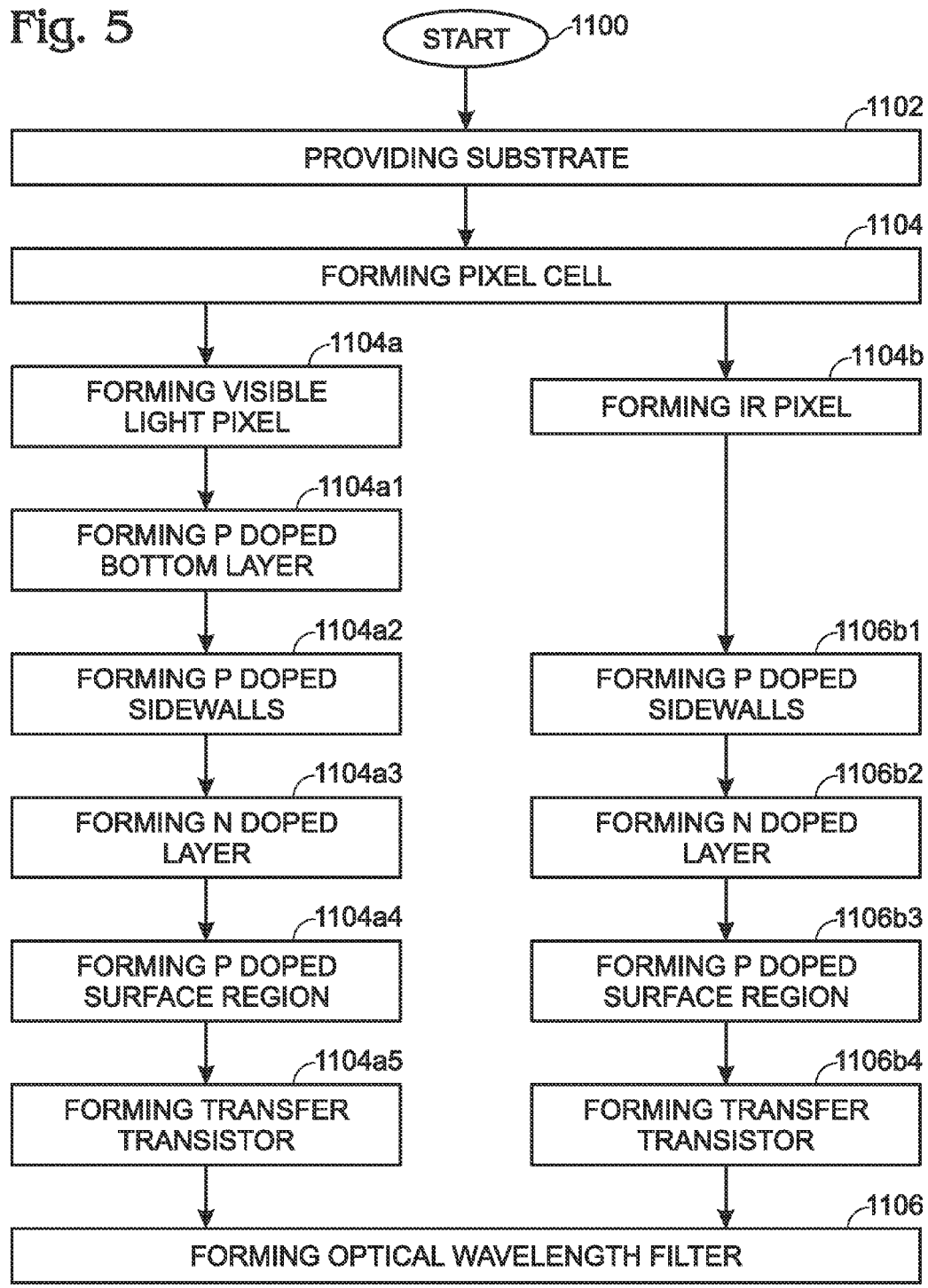

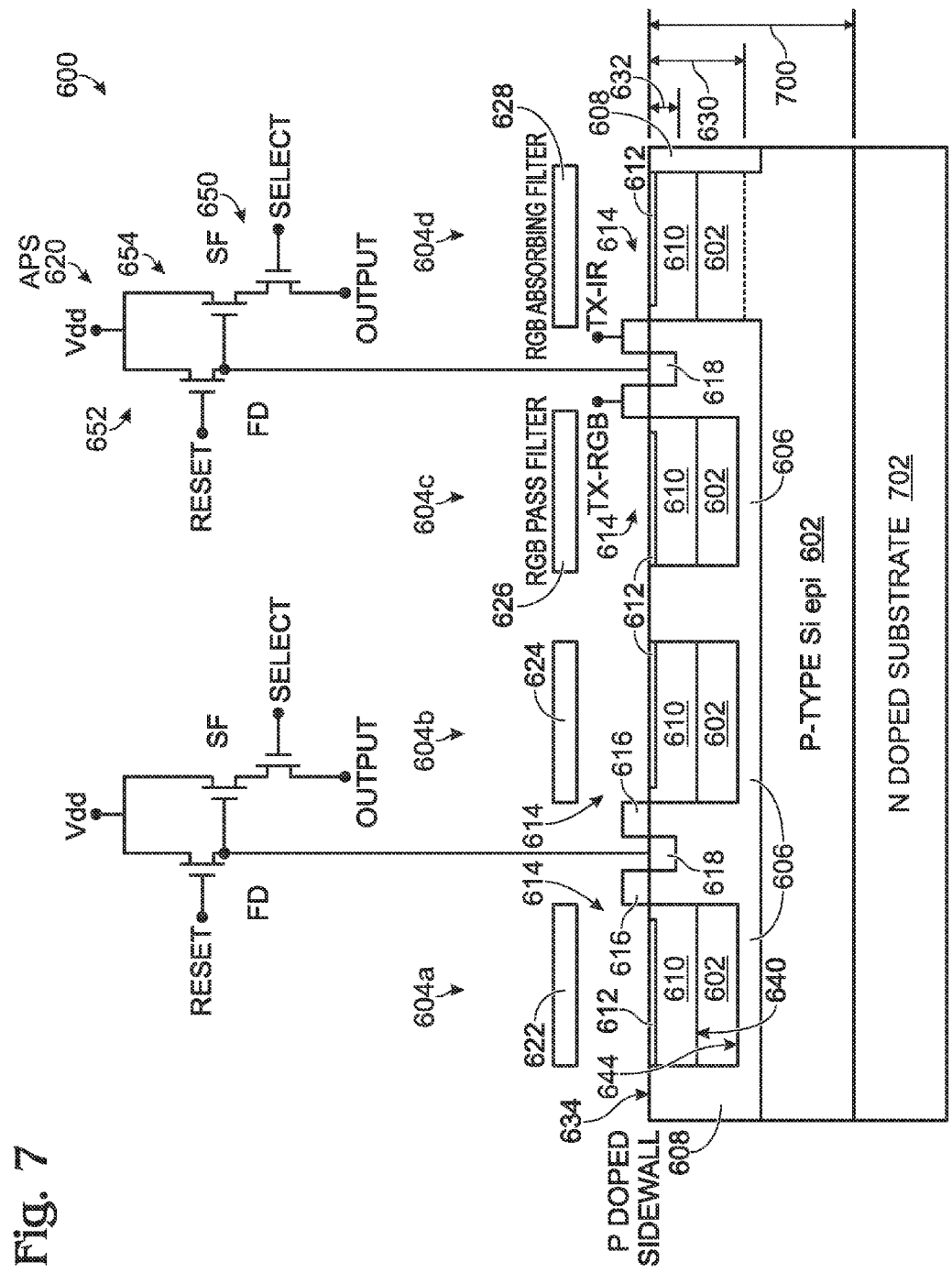

ized CMOS imager sensor

INTEGRATED INFRARED AND COLOR CMOS IMAGER SENSOR

BACKGROUND OF THE INVENTION

1. Field of the Invention

This invention generally relates to integrated circuit (IC) fabrication and, more particularly, a CMOS imager capable of detecting both visible light and near infrared (IR), and an associated fabrication process.

2. Description of the Related Art

FIG. 1 depicts a complementary metal oxide semiconductor (CMOS) imager with a "buried" or "pinned" photodiode and a four-transistor (4T) active pixel sensor (APS) (prior art). Conventionally, the image cell, circuit includes four transistors and one photodiode. The pixel operation is divided into three main stages: reset, exposure, and reading.

(1) The reset stage: by turning on the reset and transfer (Tx) transistors, the photodiode capacitance is charged to a reset voltage. As for the case of the p+np buried photodiode shown in FIG. 1, the buried cathode (n) is totally depleted and set to the pinned voltage ($V_{pin}$).

(2) The exposure stage: with the absorption of light by the photodiode, electron and hole pairs are generated. The holes fill the depleted acceptor sites in the p-region, and the electrons fill the depleted donor sites in the n-region. The potential of the photodiode cathode decreases as the photoelectrons fills up at the donor sites.

(3) The reading stage: the pixel value, is read out by a correlated double sampling (CDS) circuit. First, the select transistor and the reset transistor are turned on, the floating diffusion (FD) is set to high, and the output is set to the reference level. Then, the transfer transistor (Tx) is turned, on, the accumulated photo-electrons in the photodiode are transferred to the FD. Photo-charges in FD are converted to the signal voltage by a source follower (SF) and read out as signal voltage level. The signal is constructed, by subtracting the reference voltage level from the signal voltage level (see FIG. 2).

FIG. 2 is a timing diagram associated with of the pixel circuit of FIG. 1 (prior art). The advantage of using a buried photodiode in a CMOS imager sensor is that low dark currents may be obtained. If the charge in the buried n-cathode can be completely depleted during the reset, and the signal electrons in the buried n-cathode can be completely transferred, then zero lag and zero reset noise can be achieved. Several device design parameters optimizations, such as low voltage depleted diode, wide transfer transistor, low threshold voltage, and high gate voltage on transfer transistor must be considered to achieve the complete transfer of the signal electrons in the buried n-cathode.

FIG. 3 is a Bayer color filter pattern (prior art). Conventional CMOS and charge-coupled device (CCD) digital image sensors use a standard photodiode or photogate as the photosensing element. In their native state, the photosensing element, captures the light signal as black-and-white. In order to perform color imaging, small color filters are placed on top of each photo sensing element. Usually the red, green, and blue (RGB) color filters are arranged in a Bayer pattern, as shown, which alternately samples red, green, and blue pixels. A required image-processing step for Bayer pattern sensors is interpolation, during which missing data is estimated from neighboring pixel data. Silicon has characteristic photon absorption lengths that vary with the energy of the photons absorbed. For the wavelengths of 450 nanometers (nm), 550 nm, and 650 nm, the absorption lengths are 0.24 microns ($\mu m$), 1.13 $\mu m$, and 3.17 $\mu m$, respectively. This variation provides an opportunity to fabricate stacked diode junctions at depths that are capable of separating photons of various wavelengths, using standard CMOS manufacturing processes. Various technologies have been applied to this idea over the past 30 years and full color imaging is available in the market place.

In modern CMOS imager fabrication, the APS cell has moved from 3 transistors (3T) to a 4T buried photodiode APS. The advantage of using a buried photodiode in a CMOS imager sensor is that low dark currents may be obtained. If the charge in the buried n-cathode can be completely depleted during the reset, and the signal electrons in the buried n-cathode can be completely transferred, then zero lag and zero reset noise can be achieved.

FIG. 4 is a cross-sectional view of a vertically integrated combination infrared (IR) and visible light photodetection device (prior art). There are several advantages to a solid state image sensor with the capability to separately detect information in the visible range and near IR range at the same time, especially for automobile and surveillance applications. Lyu et al. present a vertically integrated photodiode structure where an IR photodiode is fabricated under a visible light photodiode. In order to get good visible light detection, the depth of the top photodiode is in the range of 2 microns. The photodiode for IR detection is, therefore, fabricated deeper than 2 microns.

In the case of Lyu's device, the top photodiode for the visible light detection can be made as a buried structure, so the pixel cell can be a 4T APS. However, the use of a 4T APS is impractical, as the bottom photodiode for the IR detection is so deep that a complete charge transfer is almost impossible. The photo charge is stored in the deep (n doped) cathode during exposure. After exposure, these charges must be transferred a relatively long distance to the top surface. In the case of a 4T APS, the charge must be transferred to the floating diffusion node before it can be read. If the 4T APS is used for the IR detection, the device has a high noise and image lag resulting from incomplete charge transfer. The design could be enabled using a 3T APS, however, such a CMOS imager is widely known to suffer from high circuit noise and high dark current.

It would be advantageous if a combination full (three) color and IR pixel cell could be simply fabricated using a design that promoted complete charge transfer.

SUMMARY OF THE INVENT ION

Described herein is a CMOS imager structure that can detect IR and visible light. The device does not required vertically integrated photodiodes, as both the IR pixel and visible light detection pixels use a 4T buried photodiode. APS. Therefore, low leakage current, low reset noise, and complete charge transfer are possible.

Accordingly, an integrated infrared (IR) and full color complementary metal oxide semiconductor (CMOS) imager array is provided. The array is built upon a lightly doped p doped silicon (Si) substrate. In one aspect, the p doped Si substrate is an epitaxial layer overlying an n doped substrate. The array is made up of a plurality of pixel cells. Each pixel cell includes at least one visible light detection pixel and an IR pixel. Each visible light, pixel includes a moderately p doped bowl with a bottom p doped layer and p doped sidewalls. An n doped layer is enclosed by the p doped bowl, and a moderately p doped surface region overlies the n doped layer. A transfer transistor has a gate electrode overlying the p doped sidewalk, a source formed from the n doped layer, and an n+ doped drain connected to a floating diffusion region. The IR pixel includes moderately doped sidewalls there is no moderately p doped bottom layer. An n doped layer is enclosed by the p doped sidewalls, and a moderately p doped surface region overlies the n doped layer. A transfer transistor with a gate electrode overlies the p doped sidewalk, as source is formed from the n doped layer, and an n+ doped drain is connected to the floating diffusion region. An optical wavelength filter overlies the visible light and IR pixels.

Additional details of the above-described array and an associated fabrication process are provided below.

BRIEF DESCRIPTION OF THE DRAWINGS

FIG. 1 depicts a complementary metal oxide semiconductor (CMOS) imager with a "buried" or "pinned" photodiode and a four-transistor (4T) active pixel sensor (APS) (prior art).

FIG. 2 is a timing diagram associated with of the pixel circuit of FIG. 1 (prior art).

FIG. 3 is a Bayer color filter pattern (prior art).

FIG. 5 is a flowchart illustrating a method for forming an integrated IR and full color CMOS imager array.

FIG. 7 is a partial cross-sectional view depicting a variation of the array of FIG. 6.

DETAILED DESCRIPTION

Figure 6:
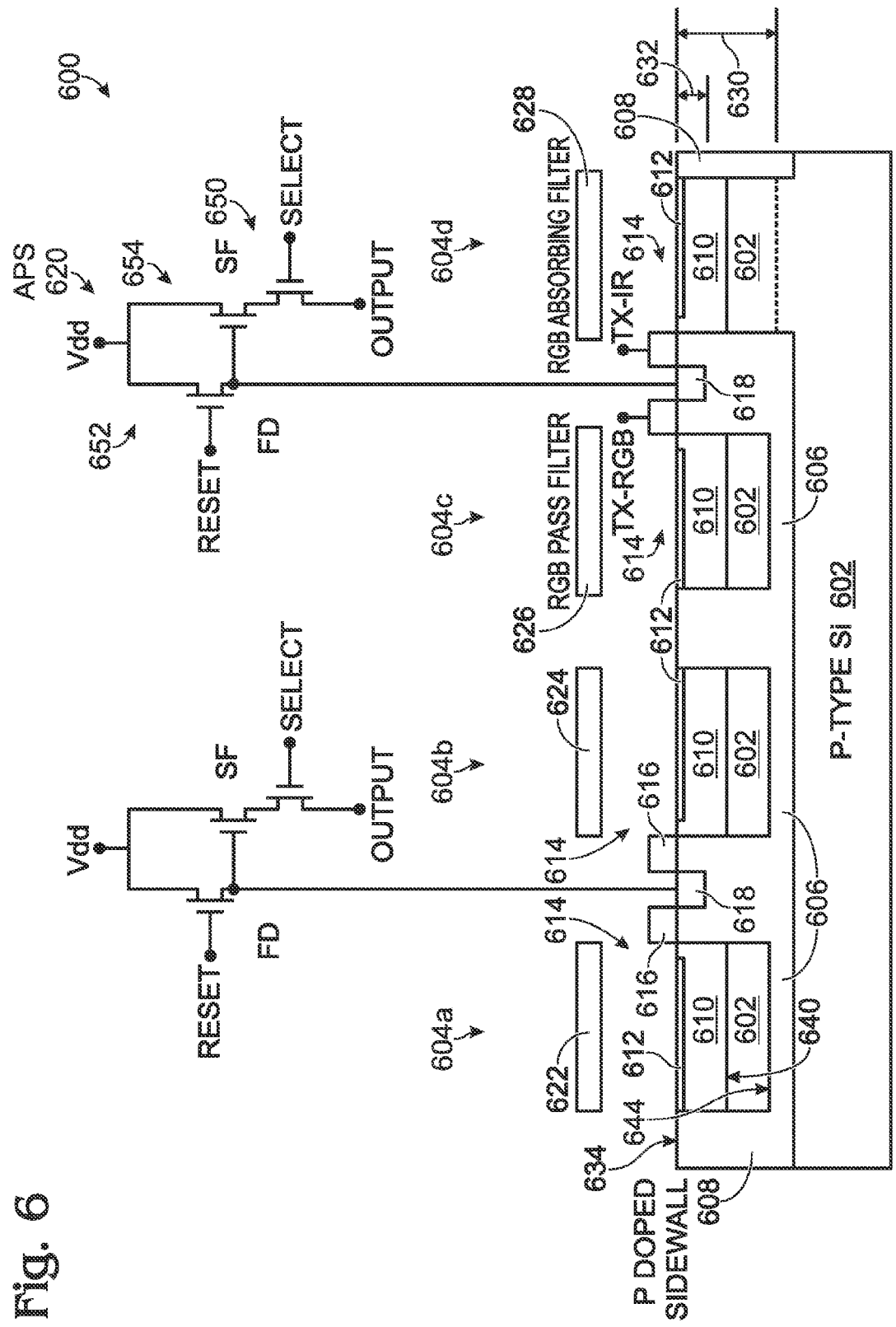
FIG. 6 is a partial cross-sectional view of an integrated IR and full color complementary metal oxide semiconductor (CMOS) imager array.

FIG. 6 is a partial cross-sectional view of an integrated IR and full color complementary metal oxide semiconductor (CMOS) imager array. The array 600 comprises a lightly doped p doped silicon (Si) substrate 602 and a plurality of pixel cells. Each pixel cell includes at least one visible light detection pixel. Shown are three visible light detection pixels 604a, 604b, and 604c. In other aspect, see FIG. 9B, each IR with more than three visible light detection pixels. In other words, there is no limitation to the number of visible light, detection pixels that may be associated with an IR pixel.

Each visible light pixel 604 includes a moderately p doped bowl with a bottom p doped layer 606 and p doped sidewalls 608. An n doped layer 610 is enclosed by the p doped bowl. A moderately p doped surface region 612 overlies the n doped layer 610. A transfer transistor 614 has a gate electrode 616 overlying the p doped sidewalk 608, a source formed from the n doped layer 610, and an n+ doped drain 618 connected to a floating diffusion region. Transfer transistor 614 may be part of a 4T active pixel sensor (APS) 620. The other three transistors of the APS (320 need not be located immediately adjacent the pixel.

An IR pixel 604d includes moderately p doped sidewalls 608, an n doped layer 610 enclosed by the p doped sidewalls, and a moderately p doped surface region 612 overlying the n doped layer 610. A transfer transistor 614 has a gate electrode 616 overlying the p doped sidewalls 608, a source formed from the n doped layer 610, and an n+ doped drain 618 connected to the floating diffusion region. The (same) floating diffusion region is electrically connected drains of the visible light and IR transfer transistors. As shown, an APS circuit can be shared between an IR pixel and a visible detecting pixel, or between visible light detection pixels. While it is not necessary to use a shared APS, the use of a shared APS increases the fill factor of the imager pixel. In one aspect (not shown), the floating diffusion regions of more than two adjacent pixels (e.g., 4 pixels) may all be electrically connected together, so the select, SF (source follower), and reset transistors can be shared by all four pixels.

In one aspect as shown, one of the visible light detecting pixels (i.e. pixel 604c) and the IR pixel 604d share a four transistor active pixel sensor (APS) 620 with a common (shared) select transistor 650, a common reset transistor 652, a common follower transistor 654, and common floating diffusion region 618.

An optical wavelength filter overlies the visible light pixels 604a, 604b, and 604c, as well as IR pixel 604d. More explicitly, the optical wavelength filter includes a first filter section 622 transmitting a first wavelength of light in the visible spectrum (e.g., red) and IR wavelengths, overlying the first pixel 604a. A second filter section 624 transmits a second wavelength of light in the visible spectrum (e.g., green) and the IR wavelengths, overlying the second pixel 604b. A third filter section 626 transmits a third wavelength of light in the visible spectrum (e.g., blue) and the IR wavelengths, overlying the third pixel 604c. A fourth filter section 628 transmits IR wavelengths overlying the IR pixel 604d.

In one aspect, the bottom p doped layer 606 of each visible light pixel 604 is formed at a first depth 630. The n doped layer 610 of each visible light pixel 604a, 604b, and 604c, as well as the IR pixel 604d are formed at a second depth 632. The first depth and second depths are defined herein as the distance from the surface 634 to the locations where the dopant is maximally concentrated.

In another aspect, the IR pixel 604d includes a lightly p doped layer of the p doped substrate 602 underlying the n doped layer 610. In a different aspect, as shown, each visible light pixel 604a, 604b, and 604c includes a lightly p doped layer of the p doped substrate 602 interposed between a top surface 644 of the bottom p doped layer 606 and the bottom surface 640 of the n doped layer 610. Alternately but not shown, top surface 644 directly underlies bottom surface 640, without an intervening lightly p doped layer.

FIG. 7 is a partial cross-sectional view depicting a variation of the array of FIG. 6. In this aspect, the p doped Si substrate 602 is an epitaxial layer having a thickness 700 of at least 10 microns. A lightly n doped substrate 702 underlies the p doped Si epitaxial layer 602.

A lightly n doped substrate has a dopant concentration in the range of about $5 \times 10^{14}$ to $1 \times 10^{16}$ cm$^{-3}$. A moderately n doped region, as defined herein, is associated with dopant concentrations in the range of about $5 \times 10^{15}$ to $1 \times 10^{18}$ cm$^{-3}$, the n+ doped floating diffusion areas have dopant concentrations in the range of about $1 \times 10^{19}$ to $1 \times 10^{21}$ cm$^{-3}$. For the p doped regions, the moderately doped concentrations are in the range of about $5 \times 10^{15}$ to $1 \times 10^{19}$ cm$^{-3}$. The lightly p doped substrate and the p doped epi layer have dopant concentrations in the range of about $5 \times 10^{14}$ to $1 \times 10^{16}$ cm$^{-3}$.

Functional Description

The imager of FIG. 6 is built on p-type silicon wafer. With R-G-B color filters, the visible light detection pixels can detect three colors separately. The structure of the IR detection pixel is similar to the visible light detection pixel, except that (1) there is no deep p-type doping layer on the bottom of the sensor, and (2) a visible light absorption filter is applied on top of the sensor. Since the IR detecting pixel and visible light detecting pixel have same cathode structure (n doped layer 610), the pinned voltage, charge transfer, leakage current performance of the two pixel types are exactly the same.

Figure 4:
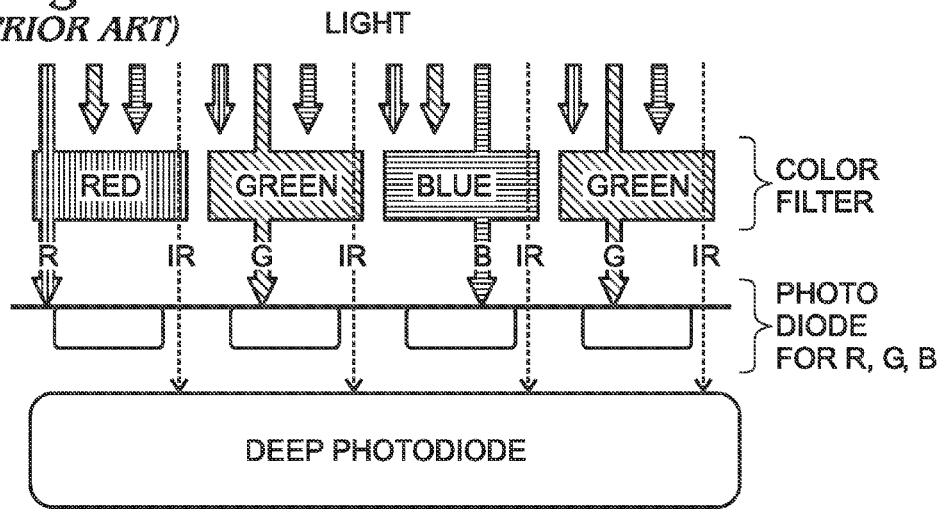
FIG. 4 is a cross-sectional view of a vertically integrated combination infrared (IR) and visible light photodetection device (prior art).
Figure 8:
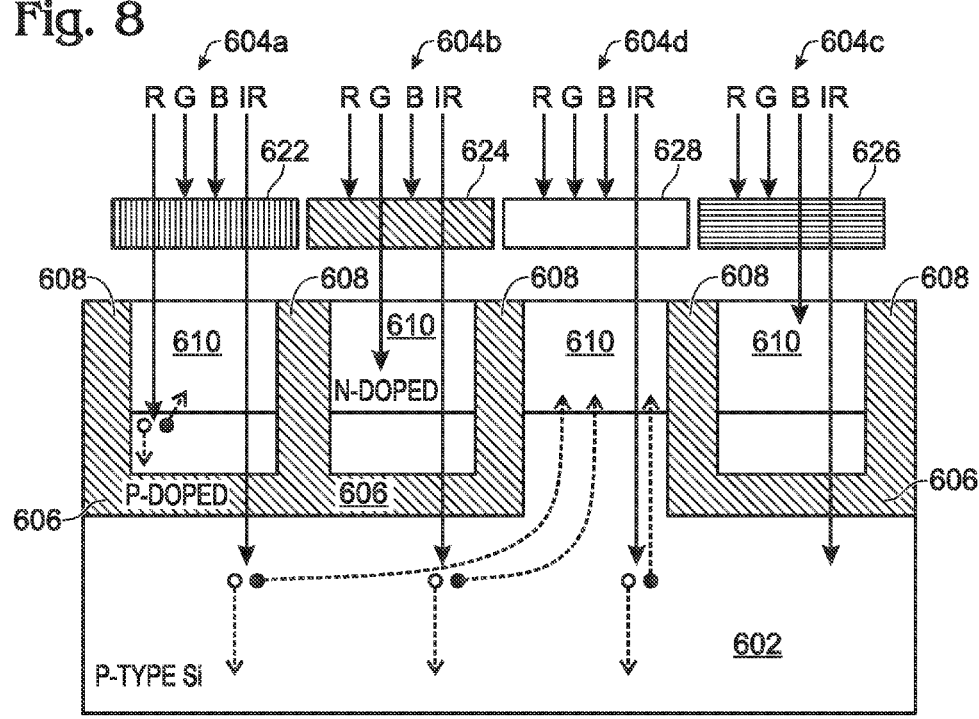
FIG. 8 is a partial cross-sectional view of the array of FIG. 6 depicting the movement of electrons and holes in response to photons.

FIG. 8 is a partial cross-sectional view of the array of FIG. 6 depicting the movement of electrons and holes in response to photons. The visible light detection pixel detects the ROB color separately using ROB color filters. Alternately but not shown, cyan, yellow, magenta (CYM) filters may be used. In the case of red color detecting pixel 604*a*, light with wavelength around 600 nanometers (nm) penetrates the red color filter 622 and get absorbed by silicon at the depth that is shallower than the bottom p-doped layer 606. The photogenerated electrons move to the cathode (ii doped layer 610) and are stored there, whereas the photogenerated holes move to the p-doped regions 606 and 608, which are electrically grounded. Accumulated photoelectrons are readout by an in-pixel circuit and peripheral circuit. Similarly, the green light and blue light are detected by the green pixel 604*b* and blue pixel 604*c*, respectively.

In the case of IR detecting pixel, the IR signal comes from not only the IR pixel 604*d*, but also from the neighboring visible light pixels, since R, G, and B color filter materials typically transmit light, beyond 700 nm. IR wavelengths penetrate the visible light absorbing filter 628, and get absorbed by the p doped silicon substrate 602. The photoelectrons move to the cathode 610 of the IR detecting pixel 604*d*, and holes move to the p-type regions 602, 606, and 608, which are electrically grounded. For signals coming from the neighboring visible pixel, IR wavelengths penetrate the RGB color filters 622, 624, and 626, and are absorbed by the silicon 602 at the location deeper than the bottom p-doped layer 606. The photoelectrons move to the cathode 610 of the IR detecting pixel 604*d*, and holes move to the p-type regions 602, 606, and 608, which are electrically grounded. The accumulated photoelectrons generated by the IR are readout by an in-pixel circuit and peripheral circuit.

As shown, the difference between the visible light sensor pixel and the IR sensor pixel is that the former has a bottom p-doped (p doped) layer 606 and the later does not. The p-doped layer 606 on the lightly p-doped substrate 602 creates a small potential barrier that separates the photoelectrons. For the visible light pixels, photoelectrons generated at a depth shallow than the p-doped layer 606 move to the cathode 610 of the visible light pixel. Photoelectrons generated at the depth deeper than the p-doped layer 606 do not move to the cathode of the visible light pixels because of the potential barrier at 606. Instead, the deeper generated photoelectrons move to the nearby IR cathode 610 because there is no potential barrier.

Figure 9A:
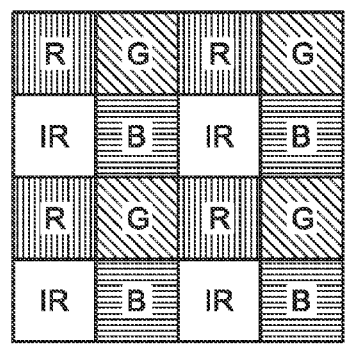
FIGS. 9A and 9B are plan views depicting two possible arrangement of visible light and IR pixels.
Figure 9B:
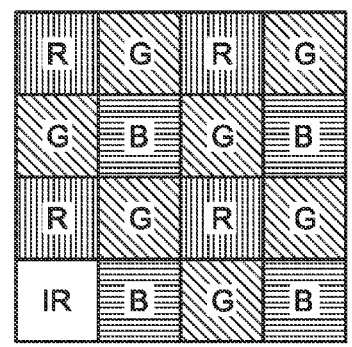

FIGS. 9A and 9B are plan views depicting two possible arrangement of visible light, and IR pixels. The pixel arrangements can be varied depending upon the application. For example, if a camera needs a high resolution IR image, then IR pixels can occupy 25% of the imager, and the RGB and IR arrangement can be as shown in FIG. 9A. If the camera needs high resolution, visible detection and lower resolution IR, then the IR pixel can occupy only 1/16 of the imager area and the RGB and IR arrangement can be as shown in FIG. 9B. Other arrangements are possible.

FIGS. 10A through 10E depict steps in fabrication of the visible light and IR pixel cell. The device can be fabricated on p-type silicon substrate (FIG. 6), an n-type silicon wafer (not shown), a p-type epi on n-type silicon wafer (FIG. 7), or SOI wafer (not shown). The device structure is the same on various wafers, but the type of doping is opposite for devices fabricated on n-type silicon substrate, as compared to devices fabricated on the p-type silicon wafer. FIGS. 10A-10E describe a simplified fabrication on a p-type bulk silicon substrate. However, the device could be fabricated using alternate steps.

Figure 10A:
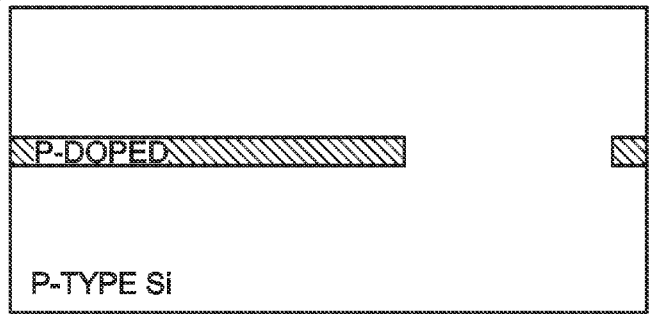
FIGS. 10A through 10E depict steps in fabrication of the visible light and IR pixel cell.

FIG. 10A starts with a p-type silicon wafer with a doping level between $5 \times 10^{14}$ to $1 \times 10^{16}$ cm$^{-3}$. Deep boron implants are performed to form a potential barrier. The boron ion implantation energy is in the range of 800 keV to 3 MeV, with a dose of around 1e12 cm$^{-2}$, to 5e13 cm$^{-2}$. The implantation may be performed using multiple boron on implantations. In such a case, a higher dose is used for higher implantation voltages, so that a gradient can be built up, permitting photoelectrons to drift to the lower boron density region. The depth of boron implanted into the silicon is between 1.4 microns to 3 microns. The definition, of the depth is the distance from the silicon surface to the position within p doped layer having the peak boron density. The deep boron implant is only performed in the visible light detecting pixel, not the IR detecting pixel.

Figure 10B:
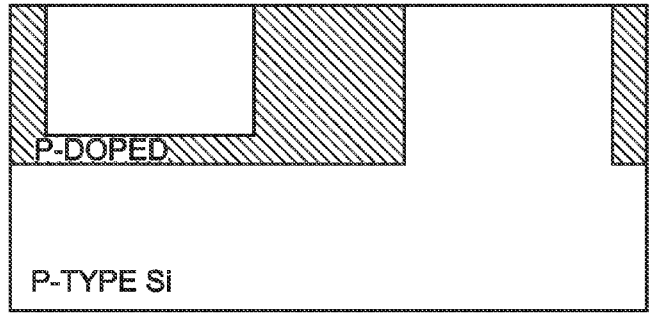

In FIG. 10B, a boron isolation implant is performed to isolate each pixel. This implant is performed using multiple implants with an energy between 20 keV to 2 MeV. The dopant density in this region is between 5E15 cm$^{-3}$ to 5E18 cm$^{-3}$.

The bowl shaped p-region, with a boron density of ~1e17 cm$^{-3}$, is formed in the p-type Si substrate, with a boron density of ~1e15 cm$^{-3}$. Prior to the n-type doped layer being formed, the inside of the bawl doping density is the same as the p-type Si (~1e15 cm$^{-3}$).

Figure 10C:
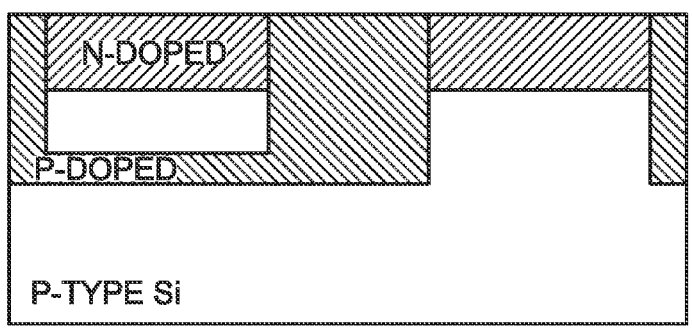

In FIG. 10C an n-type phosphorous and arsenic implant is performed to form the cathode of the PN diode. This implant can use multiple implants, with the shallower implants having a higher dopant density than the deeper implants. The dopant density is between $5 \times 10^{15}$ to $1 \times 10^{18}$. The n-type doped layer formed inside the bowl may not fill the entire area. Therefore, there is a 1e15 doped p-region between the 1e17 p-region and the n-layer. This 1e15 doped p-region is not intentionally formed by a particular process.

Figure 10D:
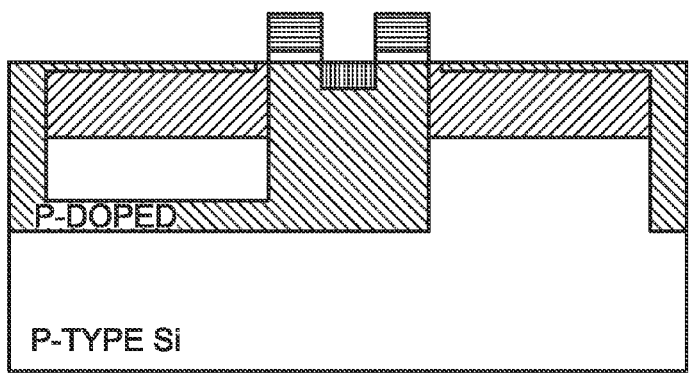

In FIG. 10D, a gate oxide and polysilicon gate are formed for the transfer transistors. Not that the MOS transistors on the peripheral of the imager and on the pixel APS circuit are fabricated concurrently with the transfer transistors shown in FIG. 10E. A p-type surface implant passivates the surface state and to form a buried photodiode. The boron density is between 1E16 to 1E19 cm$^{-3}$. An n-type source/drain implant forms the floating diffusion node.

Figure 10E:
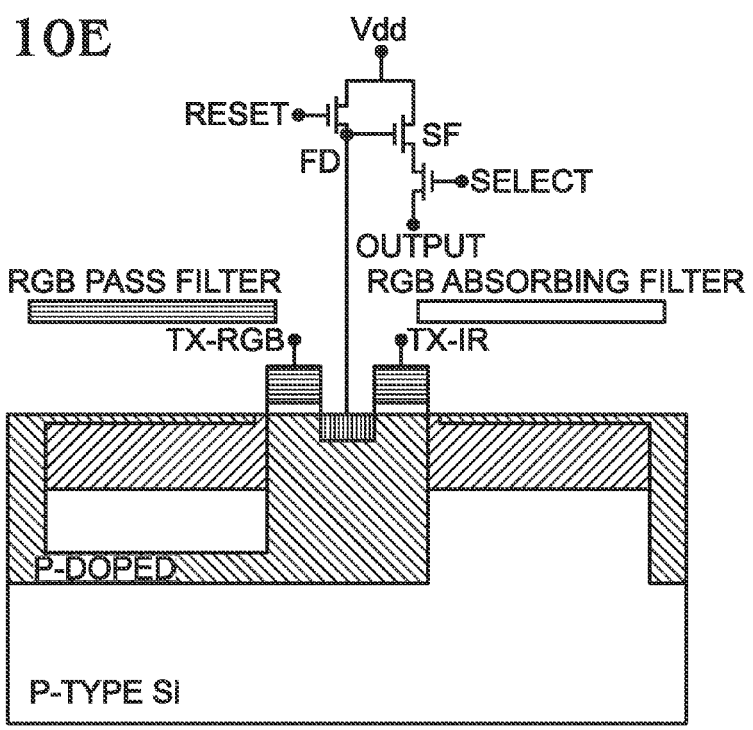

FIG. 10E depicts a completely fabricated pixel circuit. The pixel, circuit, is shared 4T APS cell, which includes a shared reset transistor, a shared select transistor, a shared source follower transistor, and individual transfer transistor on every pixel. The two pixels shared the same floating diffusion node and the in-pixel circuit (reset, select, and follower transistors). RGB passing color filters are formed over the visible detecting pixels, and an RGB absorbing color filter is formed over the IR detecting pixel.

FIG. 5 is a flowchart illustrating a method for forming an integrated IR and full color CMOS imager array. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method begins at Step 1100.

Step 1102 provides a lightly doped p doped Si substrate. In one aspect, a p doped epitaxial layer, having a thickness of at least 10 microns, is provided overlying an n doped substrate. Step 1104 forms a pixel cell. Step 1104a forms at least one visible light, detection pixel, each pixel including a moderately p doped bowl including a bottom p doped layer and p doped sidewalls, an n doped layer enclosed by the p doped bowl, and a moderately p doped surface region overlying the n doped layer. Step 1104 also forms a transfer transistor with a gate electrode overlying the p doped sidewalls, a source formed from the n doped layer, and an n+ doped drain connected to a floating diffusion region. Step 1104b forms an IR pixel including moderately p doped sidewalls, an n doped layer enclosed by the p doped sidewalls, and a moderately p doped surface region overlying the n doped layer. Step 1104b also forms a transfer transistor with a gate electrode overlying the p doped sidewalls, source formed from the n doped layer, and an n+ doped drain connected to the floating diffusion region. Step 1106 forms an optical wavelength filter overlying the visible light and IR pixels.

In one aspect, forming the visible light detection pixel in Step 1104a includes the additional substep of Step 1004a1, forming the bottom p doped layer by implanting a peak density of boron (B) at a depth in the range of 1.4 to 4 microns below the top surface of the p doped surface region. In another aspect, Step 1104a1 implants B to form the bottom p doped layer with an energy in the range of 800 kilo electron volts (keV) to 3 mega (M)eV and a dose in the range of 1e12 $cm^{-2}$ to 5e13$^{-2}$. In one variation, Step 1104a1 forms a graduated bottom p doped layer with multiple B implants, where higher doses are used with higher implantation voltages.

In another aspect, forming the visible light and IR pixels includes the substeps, Steps 1104a2 and 1104b1, respectively, of forming p doped sidewalls. The sidewalls are formed subsequent to forming the bottom p doped layer (Step 1104a1), using multiple implants of B with an energy in the range of 20 keV to 2 MeV and a dopant density in the range of 5e15 $cm^{-3}$ to 5e18$^{-3}$.

In another aspect, forming the visible light and IR pixels includes the substeps, Steps 1104a3 and 1104b2, respectively, of forming the n doped layers. The n doped layer are formed subsequent to forming the p doped sidewalk; (Steps 1104a2 and 1104b1), using either arsenic or phosphorus, or a combination of arsenic and phosphorous, with a dopant density in the range of $5 \times 10^{15}$ to $1 \times 10^{18}$ $cm^{-3}$. Steps 1104a3 and 1104b2 can be performed using a single implant or multiple implants.

In another aspect, forming the visible light and IR pixels includes the substeps, Steps 1104a4 and 1104b3, respectively, of forming p doped surface regions by implanting B with a doping density in the range of 1e16 $cm^{-3}$ to 1e19$^{-3}$ $cm^{-3}$. Steps 1104a5 and 1104b4 form the transfer transistors for the visible light and IR pixels, respectively.

Advantageously, Steps 1104a2 and 1104b1, of forming the p doped sidewalls, may be performed concurrently. Likewise, Steps 1104a3 and 1104b2, of forming the n doped layer, may be performed concurrently. Steps 1104a4 and 1104b3, of forming the p doped surface regions, may be performed concurrently. Steps 1104a5 and 1104b4, of forming the transfer transistors, may be performed concurrently.

An integrated full color visible light and IR pixel array has been presented. Examples of explicit structural details and process steps have been provided to illustrate the invention. However, the invention is not limited to just these examples. Other variations and embodiments of the invention will occur to those skilled in the art.

We claim:

1. An integrated infrared (IR) and full color complementary metal oxide semiconductor (CMOS) imager array comprising:
   a lightly doped p doped silicon (Si) substrate;
   a plurality of pixel cells, each pixel cell including:
      at least one visible light detection pixels, each pixel including a moderately p doped bowl with a bottom p doped layer and p doped sidewalls, an n doped layer enclosed by the p doped bowl, a moderately p doped surface region overlying the n doped layer, and a transfer transistor with a gate electrode overlying the p doped sidewalls, a source formed from the n doped layer, and an n+ doped drain connected to a floating diffusion region;
      an IR pixel including moderately p doped sidewalls, an n doped layer enclosed by the p doped sidewalls, a lightly p doped layer of p doped substrate underlying the n doped layer, a moderately p doped surface region overlying the n doped layer, and a transfer transistor with a gate electrode overlying the p doped sidewalls, a source formed from the n doped layer, and an n+ doped drain connected to the floating diffusion region; and,
   an optical wavelength filter overlying the visible light and IR pixels.

2. The array of claim 1 wherein the bottom p doped layer of each visible light pixel is formed at a first depth, and wherein the n doped layers of each visible light pixel and the IR pixel are formed at a second depth.

3. The array of claim 1 wherein the pixel cell includes at least three visible light pixels include a first pixel, and second pixel, and a third pixel; and,
   wherein the optical wavelength filter includes a first filter section transmitting a first wavelength of light in the visible spectrum and IR wavelengths, overlying the first pixel, a second filter section transmitting a second wavelength of light in the visible spectrum and the IR wavelengths, overlying the second pixel, a third filter section transmitting a third wavelength of light in the visible spectrum and the IR wavelengths, overlying the third pixel, and a fourth filter section transmitting IR wavelengths overlying the IR pixel.

4. The array of claim 3 wherein each visible light pixel includes a lightly p doped layer of the p doped substrate interposed between a top surface of the bottom p doped layer and a bottom surface of the n doped layer.

5. The array of claim 1 wherein the p doped Si substrate is an epitaxial layer having a thickness of at least 10 microns; and,
   the array further comprising:
   a lightly n doped substrate underlying the p doped Si epitaxial layer.

6. The array of claim 1 wherein at least one visible light detecting pixel and the IR pixel share a four transistor active pixel sensor (APS) with a common select transistor, a common reset transistor, a common follower transistor, and a common floating diffusion region.

* * * * *